(12) United States Patent
Lin

(10) Patent No.: US 6,218,307 B1
(45) Date of Patent: Apr. 17, 2001

(54) METHOD OF FABRICATING SHALLOW TRENCH ISOLATION STRUCTURE

(75) Inventor: Bih-Tiao Lin, Ping-Tung Hsien (TW)

(73) Assignee: Taiwan Semiconductor Mfg. Co., Ltd., Hsinchu (TW)

( * ) Notice: Subject to any disclaimer, the term of this patent is extended or adjusted under 35 U.S.C. 154(b) by 0 days.

(21) Appl. No.: 09/286,014

(22) Filed: Apr. 5, 1999

(30) Foreign Application Priority Data

Mar. 19, 1999 (TW) .................................................. 88104324

(51) Int. Cl.[7] .................................................. H01L 21/302
(52) U.S. Cl. ................................................ 438/692; 700/704
(58) Field of Search .................................... 438/700, 692, 438/704

(56) References Cited

U.S. PATENT DOCUMENTS

| | | |
|---|---|---|
| 5,728,621 * 3/1998 | Zheng et al. | 438/427 |
| 5,976,949 * 11/1999 | Chen | 438/427 |
| 6,057,210 * 5/2000 | Yang et al. | 438/427 |

* cited by examiner

Primary Examiner—Robert Kunemund
Assistant Examiner—Lynette T. Umez-Eronini
(74) Attorney, Agent, or Firm—Jiawei Huang; J C Patents

(57) ABSTRACT

A method for fabricating a shallow trench isolation structure. A pad oxide layer and a pad silicon nitride layer are formed over a substrate and are patterned to form a trench in the substrate. A high-density plasma (HDP) oxide layer is formed to fill the trench of a certain thickness. A silicon nitride layer is formed over the substrate. The silicon nitride layer and the oxide layer together form a protruding portion. A chemical-mechanical polishing is performed in a range of from at least removing the protruding portion to exposing the silicon nitride layer. The HDP oxide layer is etched until the HDP oxide layer on the pad silicon nitride layer is removed. The pad silicon nitride layer and the silicon nitride layer are removed by etching.

13 Claims, 3 Drawing Sheets

METHOD OF FABRICATING SHALLOW TRENCH ISOLATION STRUCTURE

CROSS-REFERENCE TO RELATED APPLICATION

This application claims the priority benefit of Taiwan application serial no. 88104324, filed Mar. 19, 1999, the full disclosure of which is incorporated herein by reference.

BACKGROUND OF THE INVENTION

1. Field of the Invention

The present invention relates to a semiconductor fabricating method. More particularly, the present invention relates to a method of fabricating an isolation region.

2. Description of the Related Art

In a conventional fabrication method of forming the shallow trench isolation (STI) structure, a pad silicon nitride layer is formed on active regions to protect the substrate during a chemical-mechanical polishing step. Typically, in order to prevent stress problems, the pad silicon nitride layer cannot be too thick. The preferred thickness of the pad silicon nitride layer is usually about 100 angstroms to 200 angstroms, or about 1500 angstroms. However, because of this certain thin pad silicon nitride layer, it is easy to form scratches in the active regions while the chemical-mechanical polishing is performed. The depth of the typical scratch even can reach 1000 angstroms. The scratches and other possible defects, which usually form on a corner of a STI structure, may reduce the performance of devices.

SUMMARY OF THE INVENTION

The invention provides a method of fabricating a shallow trench isolation structure. A pad oxide layer and a pad silicon nitride layer are formed over a substrate. The pad oxide layer, the pad silicon nitride layer, and the substrate are patterned to form a trench in the substrate. A high-density plasma (HDP) oxide layer is formed by HDP deposition to fill the trench. A minimum thickness of the HDP oxide layer is the same as the depth of the trench plus the thickness of the pad oxide layer. A maximum thickness of the HDP oxide layer is the same as the depth of the trench plus the thickness of the pad oxide layer and the thickness of the pad silicon nitride layer. A silicon nitride layer is formed over the substrate. The silicon nitride layer and the oxide layer together form a protruding portion. A chemical-mechanical polishing is performed in a range of from at least removing the protruding portion to exposing the silicon nitride layer. The HDP oxide layer is etched until the HDP oxide layer on the pad silicon nitride layer is removed. The pad silicon nitride layer and the silicon nitride layer are removed by etching.

The chemical-mechanical polishing step is performed in a range of from at least removing the protruding portion to exposing the silicon nitride layer. Because the chemical-mechanical polishing is not performed on regions near the substrate, the present invention prevents the active region, which is next to the STI structure, and the STI structure, from being scratched. The reliability of devices thus is enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

In the drawings.

DESCRIPTION OF THE PREFERRED EMBODIMENTS

Figure 1A:
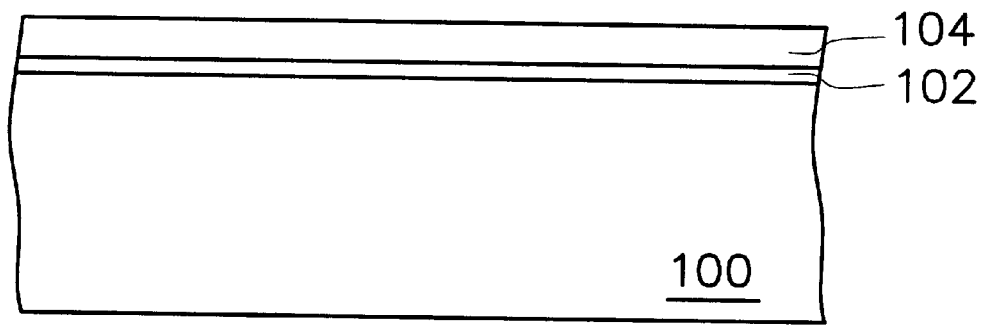
FIGS. 1A through 1H are schematic, cross-sectional views showing a method of fabricating a shallow trench isolation structure according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1H are schematic, cross-sectional views showing a method of fabricating a shallow trench isolation structure according to one preferred embodiment of the invention.

In FIG. 1A, a pad oxide layer 102 and a pad silicon nitride layer 104 are formed in sequence over the substrate 100, such as a silicon substrate. The thickness of the pad oxide layer 102 is preferably about 200 angstroms. The thickness of the pad silicon nitride is preferably about 1600 angstroms.

Figure 1B:
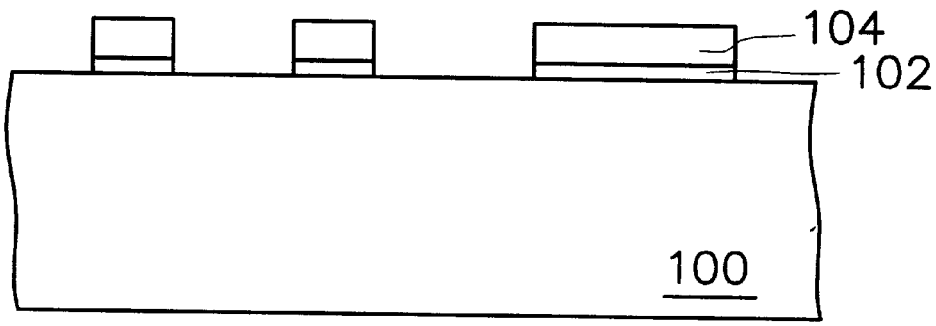

In FIG. 1B, an etching step is performed on the pad oxide layer 102 and the pad silicon nitride layer 104 to expose a portion of the substrate 100. The etching step can be performed by, for example, a conventional photolithographic process.

Figure 1C:
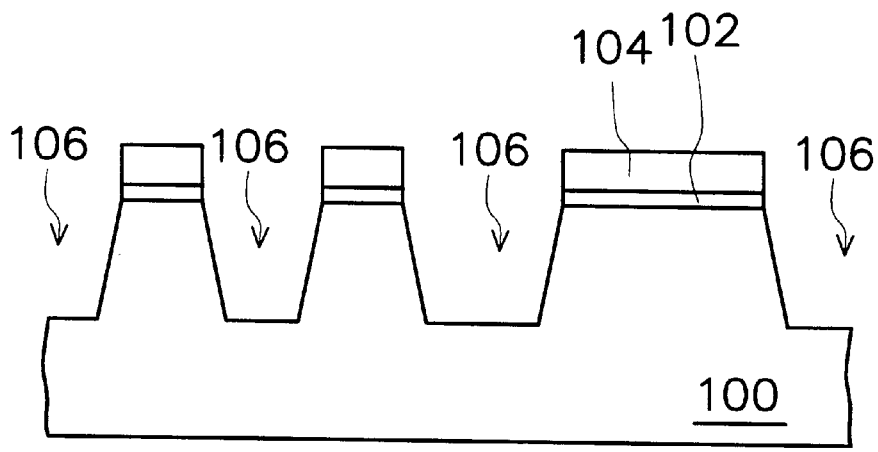

In FIG. 1C, an etching step is performed on the exposed substrate 100. A trench 106 is formed in the substrate 100. The depth of the trench 106 is preferably about 4000 angstroms. The etching step can be performed with the pad oxide layer 102 and the pad silicon nitride layer 104 serving as a mask, for example.

Figure 1D:
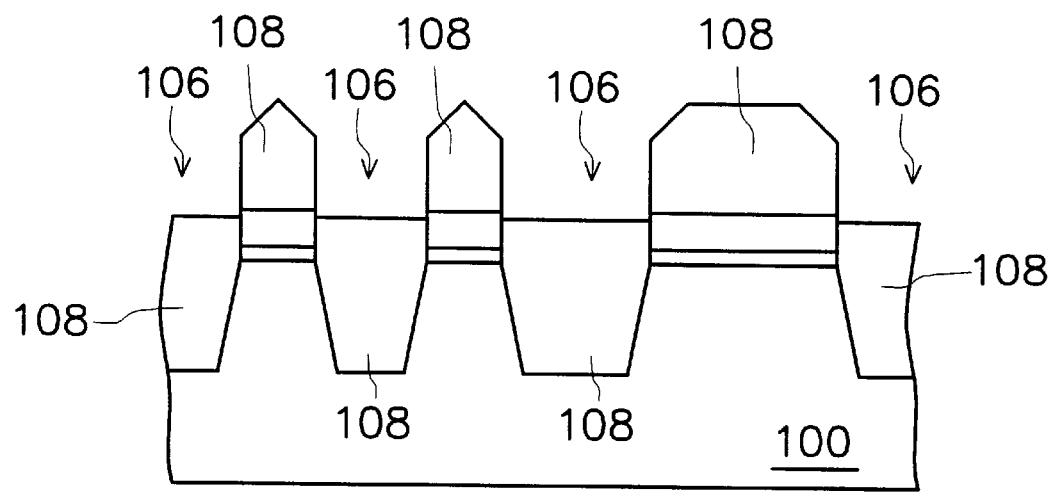

In FIG. 1D, the oxide layer 108 is formed by high-density plasma (HDP) deposition. Using the HDP oxide 108 to fill the trench 106 is first disclosed by the present invention. A HDP oxide layer 108 is formed over the substrate 100 to fill the trench 106. One important characteristic of forming HDP oxide layer 108 in the present invention, which characteristic is required in the present invention, is that the sidewall of the HDP oxide layer 108 on the pad silicon oxide layer 104 is substantially perpendicular to the substrate 100. The embodiment takes the HDP oxide layer 108 as an example, but another suitable oxide layer may be used. The minimum thickness of the HDP oxide 108 is the same as the depth of the trench 106 plus the thickness of the pad oxide layer 102. A maximum thickness of the HDP oxide layer 108 is the same as the depth of the trench 106 plus the thickness of the pad oxide layer 102 and the thickness of the pad silicon nitride layer 104. For example, when the depth of the trench 106 is 4000 angstroms, the thickness of the pad oxide layer 102 is 200 angstroms, and the thickness of the pad silicon nitride 104 is 1600 angstroms, the thickness of the HDP oxide layer 108 is preferably about 4200 angstroms to 5800 angstroms. Thus, even though the thickness requirement of the HDP oxide layer 108 is a critical point, the process window in the present invention is very wide.

Figure 1E:
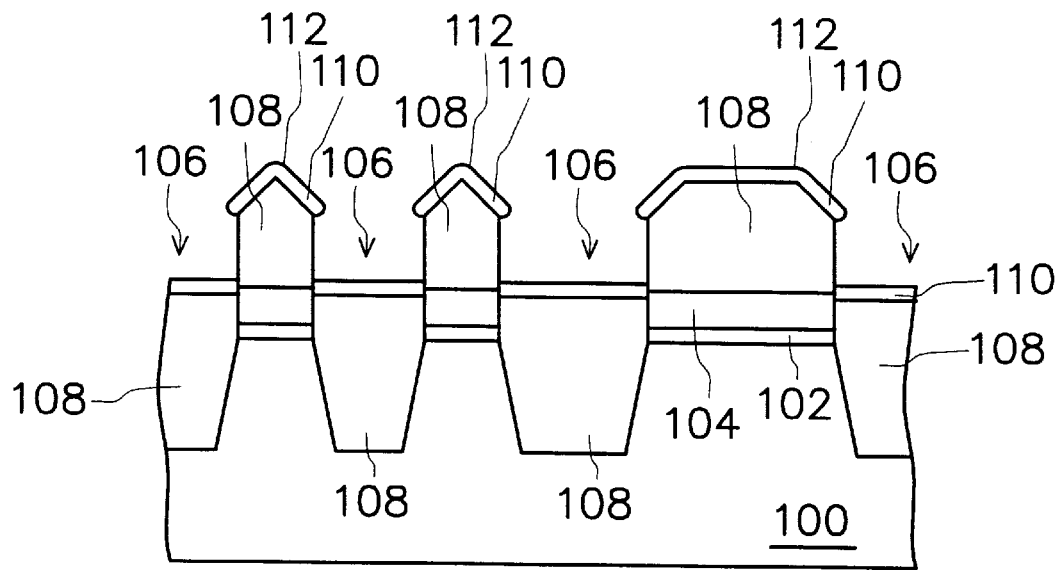

In FIG. 1E, a film layer, such as a silicon nitride layer 110 or a polysilicon layer (not shown), is deposited. Besides depositing silicon nitride layer 110 and the polysilicon layer, any material having a high etching selectivity with the HDP oxide layer 108 may be deposited. The present invention takes a deposition step of the silicon nitride 110 as an example in this preferred embodiment. A silicon nitride layer 110 is formed over the substrate 100. The thickness of the silicon nitride layer 110 is preferably the same as the thickness of the pad oxide layer 102 of about 200 angstroms. Because the HDP oxide layer 108 is deposited by HDP deposition, the silicon nitride layer 110 and the HDP oxide layer 108 together form a protruding portion 112.

Figure 1F:
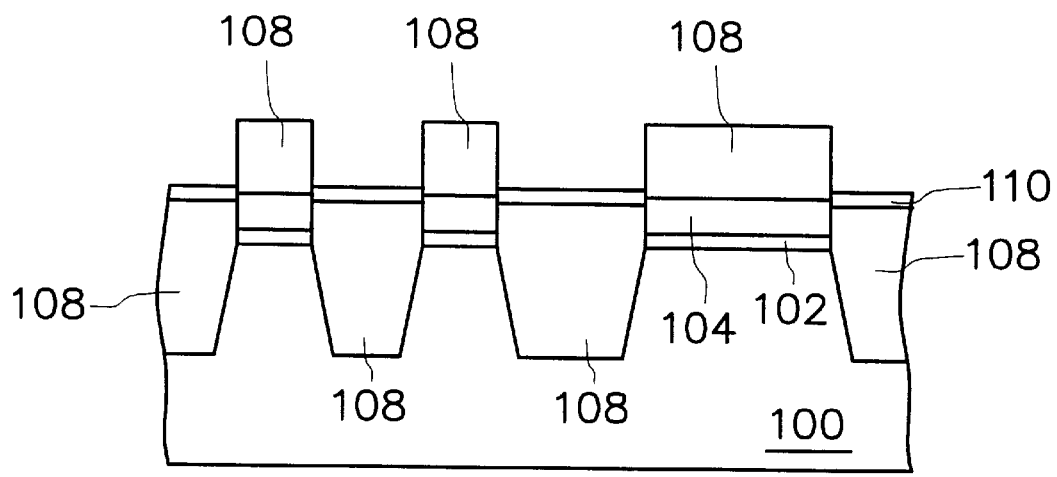

In FIG. 1F, a chemical-mechanical polishing (CPM) step is performed. The CMP step is performed only on the protruding portion 112. The process window of the CMP step is very wide. For example, the CMP step at least must remove the protruding portion 112, and can be performed until the silicon nitride layer 110 is exposed.

Figure 1G:
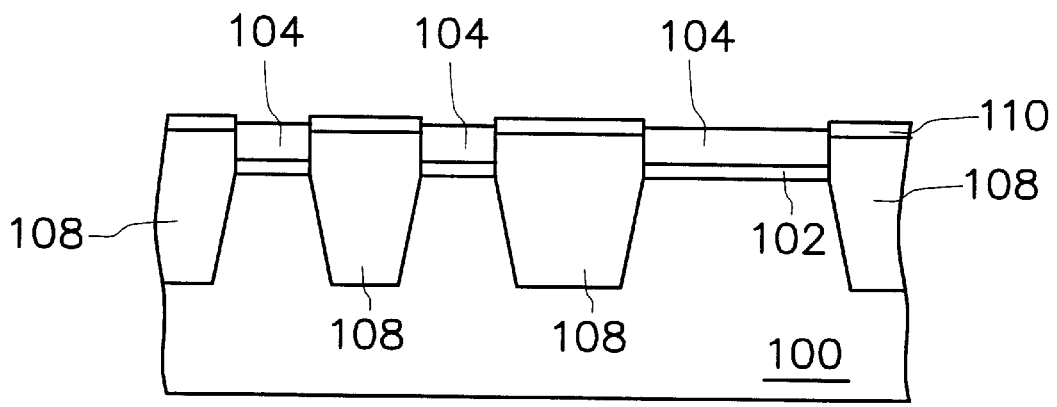

In FIG. 1G, the HDP oxide layer 108 on the pad silicon nitride layer 104 is removed by etching. The etching step can be performed by, for example, dry etching until the pad silicon nitride layer 104 is exposed. If a dry etching step is performed, it is easily performed until the pad silicon nitride layer 104 is exposed.

Figure 1H:
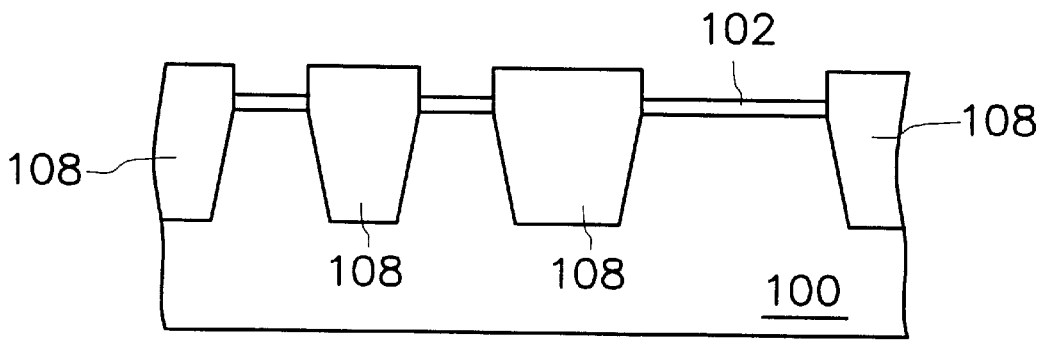

In FIG. 1H, the pad silicon nitride layer 104 (shown in FIG. 2G) and the silicon nitride layer 110 (shown in FIG. 2G) over the silicon nitride layer 110 are removed by, for example, dry etching or wet etching, and preferably by wet etching with hot phosphoric acid. Then, some follow-up steps are performed to form the STI structure. It is appreciated that the follow-up steps are well known to those skilled in the art, so these follow-up steps are not here described in detail.

The chemical-mechanical polishing step, which is described in FIG. 1F, is performed in a range of from at least removing the protruding portion 112 to exposing the silicon nitride layer 110. Because the chemical-mechanical polishing is not performed on regions that near the substrate 100, the present invention prevents the active region, which is next to the STI structure, and the STI structure from being scratched. The reliability of devices is enhanced. Moreover, according to a statistical result after performing the present invention on a wafer, the present invention decreases the scratch number by about 60% when compared with performing the conventional method on a wafer. Thus, it is proved that the present invention has the advantage of reducing the number of scratches.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation structure, comprising the steps of:
   forming a pad oxide layer and a pad silicon nitride layer over a substrate;
   etching the pad oxide layer, the pad silicon nitride layer, and the substrate to form a trench in the substrate;
   forming a high-density plasma (HDP) oxide layer by HDP deposition to fill the trench, wherein the HDP oxide layer contains a first portion and a second portion, the first portion is deposited in the trench and the second portion is deposited over the pad silicon nitride layer, and the HDP deposition is controlled such that a thickness of the HDP oxide layer is not smaller than the depth of the trench plus the thickness of the pad oxide layer, and not larger than the depth of the trench plus the thickness of the pad oxide layer and the thickness of the pad silicon nitride layer;
   forming a silicon nitride layer over the substrate covering both the first portion and the second portion of the HDP oxide layer, wherein the silicon nitride layer and the second portion of the HDP oxide layer together form a protruding portion;
   performing a chemical-mechanical polishing to remove at least a part of the protruding portion including the silicon nitride layer formed thereon;
   etching the HDP oxide layer until the second portion of the HDP oxide layer is removed; and
   removing the pad silicon nitride layer and the silicon nitride layer covering the first portion of the HDP oxide layer by etching.

2. The method of claim 1, wherein the thickness of the silicon nitride layer is about 200 angstroms.

3. The method of claim 1, wherein the thickness of the HDP oxide layer is about 4200 angstroms to 5800 angstroms.

4. A method of fabricating a shallow trench isolation structure, comprising the steps of:
   forming a pad oxide layer and a pad silicon nitride layer over a substrate;
   etching the pad oxide layer, the pad silicon nitride layer, and the substrate to form a trench in the substrate;
   forming a high-density plasma (HDP) oxide layer by HDP deposition to fill the trench, wherein the HDP oxide layer contains a first portion and a second portion, the first portion is deposited in the trench and the second portion is deposited over the substrate in areas other than the trench;
   forming a film layer over the substrate covering both the first portion and the second portion of the HDP oxide layer wherein the film layer and the second portion of the HDP oxide layer together form a protruding portion;
   performing a chemical-mechanical polishing only on the protruding portion to remove at least a part of the protruding portion including the film layer formed thereon;
   etching the HDP oxide layer until the second portion of the HDP oxide layer is removed; and
   removing the pad silicon nitride layer and the film layer covering the first portion of the HDP oxide layer by etching.

5. The method of claim 4, wherein the thickness of the silicon nitride layer is about 200 angstroms.

6. The method of claim 4, wherein the thickness of the film layer is substantially the same as the thickness of the pad oxide layer.

7. The method of claim 4, wherein the thickness of the film layer is about 200 angstroms.

8. The method of claim 4, wherein a material of the film layer comprises polysilicon.

9. The method of claim 4, wherein a material of the film layer comprises silicon nitride.

10. The method of claim 4, wherein a minimum thickness of the HDP oxide is the same as the depth of the trench plus the thickness of the pad oxide layer, and a maximum thickness of the HDP oxide us the same as the depth of the trench plus the thickness of the pad silicon oxide layer and the thickness of the pad silicon nitride layer.

11. The method of claim 4, wherein the thickness of the HDP oxide layer is about 4200 angstroms to 5800 angstroms.

12. The method of claim 4, wherein the step of forming the film layer is performed before the HDP oxide layer is etched or polished.

13. A method of fabricating a shallow trench isolation structure, comprising:

forming a pad oxide layer and a pad silicon nitride layer over a substrate;

etching the pad oxide layer, the pad silicon -nitride layer, and the substrate to form a trench in the substrate;

forming a high-density plasma (HDP) oxide layer by HDP deposition to fill the trench, wherein the HDP oxide layer contains a first portion and a second portion, the first portion is deposited in the trench and the second portion is deposited over the substrate in areas other than the trench, the second portion of the HDP oxide layer has side walls that are substantially perpendicular to the substrate;

forming a film layer over the substrate covering both the first portion and the second portion of the HDP oxide layer, wherein the second portion of the HDP oxide layer and the film layer covering the second portion of the HDP oxide layer together form a protruding portion;

performing a chemical-mechanical polishing to remove at least a part of the protruding portion including the film formed thereon;

etching the HDP oxide layer until the second portion of the HDP oxide layer is removed; and removing the pad silicon nitride layer and the film layer covering the first portion of the HDP oxide layer by etching.

* * * * *